United States Patent [19]

Tranberg

[11] 4,316,322
[45] Feb. 23, 1982

[54] METHOD OF FABRICATING ELECTRICAL CONTACTS IN A PRINTED CIRCUIT BOARD

[75] Inventor: Stephanie K. Tranberg, Oceanside, Calif.

[73] Assignee: Burroughs Corporation, Detroit, Mich.

[21] Appl. No.: 88,036

[22] Filed: Oct. 25, 1979

[51] Int. Cl.³ .............................................. H05K 3/22
[52] U.S. Cl. ...................................... 29/852; 134/38; 252/153
[58] Field of Search ................. 29/846, 852; 252/158, 252/153, DIG. 8, 170; 134/38; 427/96, 97

[56] References Cited

U.S. PATENT DOCUMENTS

| | | | |
|---|---|---|---|
| 3,276,106 | 10/1966 | Bester et al. | 29/852 |
| 3,551,204 | 12/1970 | Bolger et al. | 134/38 X |
| 3,649,475 | 3/1972 | Degnan et al. | 427/97 X |
| 3,839,234 | 10/1974 | Roscoe | 252/153 X |
| 3,886,099 | 5/1975 | Hall | 252/158 X |

OTHER PUBLICATIONS

IBM Tech. Discl. Bull., vol. 6, No. 8, Jan. 8, 1964, by Reed (p. 82).
IBM Tech. Discl. Bull., vol. 10, No. 7, Dec. 7, 1967, by Krawczyk (p. 868).

*Primary Examiner*—Francis S. Husar
*Assistant Examiner*—Carl J. Arbes
*Attorney, Agent, or Firm*—Charles J. Fassbender; Kevin R. Peterson

[57] ABSTRACT

Disclosed is a method of fabricating electrical contacts between the conductive layers of a printed circuit board which are spaced apart from each other by respective epoxy layers. The method includes the steps of drilling holes through all of the layers at predetermined points where the electrical contacts are to be made; subsequently washing the board in an acid to remove an epoxy smear that is formed on the walls of the holes by the drilling step; and thereafter rinsing the board in a mixture of 2-butoxyethanol and monoethanolamine to remove chemical byproducts of the epoxy smear and the acid.

8 Claims, 6 Drawing Figures

U.S. Patent  Feb. 23, 1982  Sheet 1 of 3  4,316,322
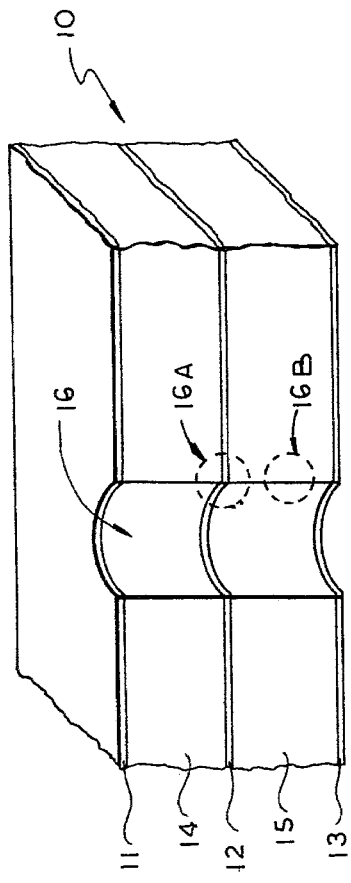
FIG. 1
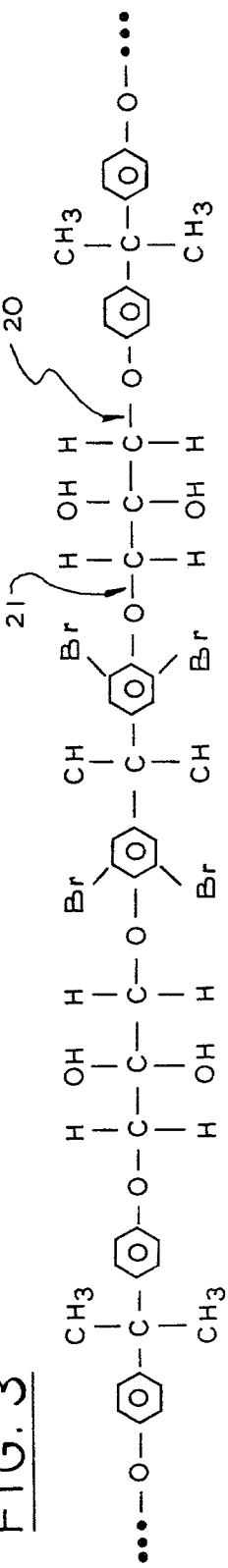
FIG. 2A
FIG. 2B
FIG. 3

METHOD OF FABRICATING ELECTRICAL CONTACTS IN A PRINTED CIRCUIT BOARD

BACKGROUND OF THE INVENTION

This invention relates to methods for fabricating multilayer printed circuit boards; and more particularly, to methods of fabricating electrical contacts between the layers. In cross section, a typical multilayer circuit board may have an outer copper layer that is followed by an epoxy layer, an inner copper layer, another epoxy layer, and an outer copper layer. And basically, the problem that is dealt with in this disclosure is how to fabricate holes through all of those layers in a manner that allows reliable electrical connections to be made between the inner and outer copper layers.

In the prior art, those contacts were made by first mechanically drilling holes of various diameters (such as 60 mils for example) through all of the layers. This mechanical drilling however, forms an epoxy smear on the walls of the holes. Sulfuric acid has been used to dissolve this smear. But as the board is subsequently rinsed in water to remove the sulfuric acid, some of the smear comes out of solution and precipitates back on the walls of the holes. This precipitate prevents reliable electrical contacts from being made between the copper layers.

Various chemicals have been used in the past in an attempt to remove this precipitate. These chemicals include:

Ethylene Glycol
2(2-phenoxyethoxy) ethanol
Isobatoxy-2-propanol
NaOH
Methyl Ethyl Ketone
Methylene Chloride
1,1,1-trichloroethene
Toluene
Acetone
Sodium Chlorite
Butyl Carbitol
Acetates However, all of those chemicals have been found unsatisfactory in that poor electrical contact with the conductive layers still intermittently occur.

Therefore, a primary object of the invention is to provide an improved method of fabricating multilayer printed circuit boards.

Another object of the invention is to provide a method of fabricating sound and reliable electrical contacts between the conductive layers of a multilayer printed circuit board.

BRIEF SUMMARY OF THE INVENTION

These and other objects are accomplished in accordance with the invention by the following steps. Initially, holes are mechanically drilled through all of the layers of the board at predetermined points where the electrical contacts are to be made. Subsequently, the board is washed in an acid to remove the epoxy smear that is formed on the walls of the holes by the drilling step. Preferably, sulfuric acid at a concentration of greater than 85% is used. Thereafter, the board is rinsed in a mixture of a glycol ether and a strong base to remove the chemical byproducts of the epoxy smear and the acid. One preferred mixture for this rinsing step consists of 50% 2-butoxyethanol and 50% monoethanolamine by volume. Excellent results have been achieved by rinsing the board in an agitated mixture at room temperature for as little as 30 seconds. Also, the solution is easy to formulate, economical to prepare, very soluble in water (which allows the mixture to be rinsed from the board), and is nonvolatile.

BRIEF DESCRIPTION OF THE DRAWINGS

Various features and advantages of the invention will best be understood by reference to the following detailed description in conjunction with the accompanying drawings wherein:

FIG. 1 is a pictorial cutaway view of a portion of a multilayer printed circuit board that can be treated by the disclosed method.

FIG. 2a is a microphotograph taken of region 16a of the FIG. 1 board after it was treated by the disclosed method.

FIG. 2b is a microphotograph of region 16a of the board of FIG. 1 after it was treated in accordance with the prior art.

FIG. 3 illustrates the chemical structure of the epoxy that formed the insulating layers in the FIG. 1 board.

DETAILED DESCRIPTION

Figure 4A:
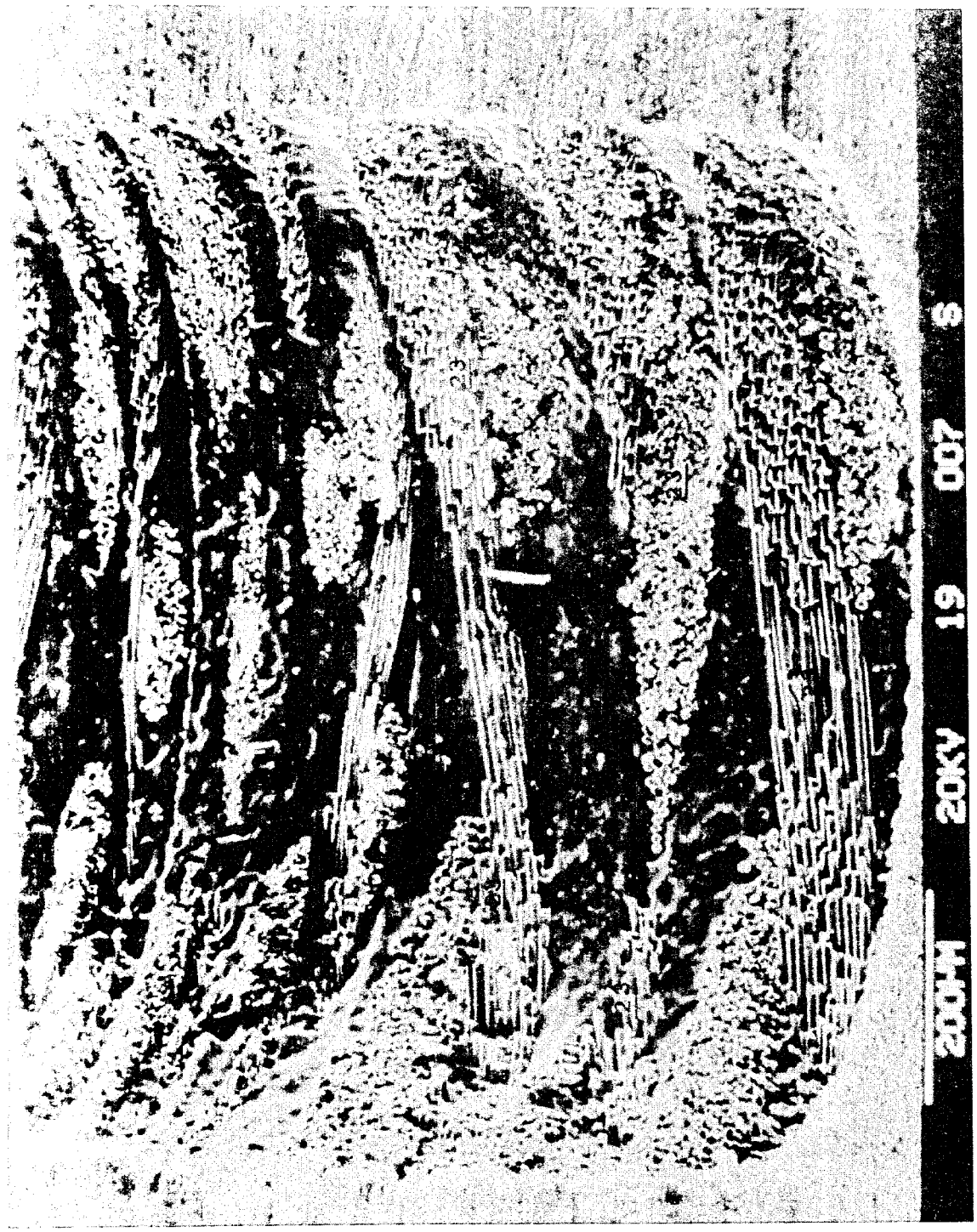
FIG. 4a is a microphotograph of region 16b of the FIG. 1 board after it was treated in accordance with the disclosed method.

Referring now to FIG. 1, there is illustrated a pictorial cutaway view of a portion of a printed circuit board 10 on which electrical contacts can be made in accordance with the invention. This circuit board includes conductive layers 11, 12, and 13 which lie parallel to each other, and which are spaced apart by insulating layers 14 and 15. Suitably, the conductive layers consist of 1–2 mil thick copper.

Each of the insulating layers 14 and 15 include an epoxy-glue mixture, such as epoxy glass and Prepeg. The thickness of these layers may range widely and is merely a design choice. In one circuit board for example, layers 14 and 15 are each approximately 30 mils thick.

Also included at predetermined points in circuit board 10 are a plurality of holes, one of which is indicated in cross-section by reference numeral 16. These holes provide a surface on which a conductive film (not shown) is deposited to make electrical contact between conductive layers 11, 12, and 13. The present invention provides a method for making those electrical contacts sound and reliable.

As a first step, the holes 16 are mechanically drilled through board 10. This drilling operation however, produces an epoxy smear on conductive layers 11, 12, and 13. To remove this smear, board 10 is washed in an acid, such as concentrated sulfuric acid. This washing breaks down the epoxy smear, and puts the breakdown byproducts in solution.

Subsequently, board 10 is rinsed in water to remove the desolved sulfonated breakdown byproducts. However, as board 10 is rinsed, the concentration of the acid drops which in turn causes some of the epoxy breakdown byproducts to come out of solution and precipitate back onto layers 11, 12, and 13. This precipitate must be removed in order for a reliable electrical contact to be made between the conductive layers.

In this invention, the above problem is solved by further rinsing the board in a mixture of a glycol ether and a strong base. Preferably, the glycol ether is 2-butoxyethanol, and the base is amine such as monoethanolamine or a hydroxide such as sodium hydroxide. In one experiment, board 10 was rinsed with a solution containing equal amounts by volume of 2-butoxyethanol and monoethanolamine. The rinsing occurred at room temperature, and lasted only approximately 30 seconds. This removed the sulfonated byproducts from conductive layers 11, 12, and 13 and enabled a sound electrical contact to subsequently be made between those conductive layers.

FIG. 2a is a microphotograph which was taken of hole portion 16a after the above experiment was carried out. In that figure, reference numerals 12, 14, 15, and 16 indicate those portions of the board which are similarly numbered in FIG. 1; and reference numeral 17 indicates the conductive film that was deposited on the sides of hole 16. This photo clearly illustrates that the contact at the interface between conductors 12 and 17 is free of defects.

By comparison, in the prior art, one of the common ways used to remove breakdown byproducts from conductive layers 11, 12, and 13 was to rinse board 10 in hot sodium hydroxide. However, this method has been found to be unsatisfactory. FIG. 2b is a microphotograph which was taken of hole portion 16a after the board was rinsed with sodium hydroxide and a conductive film 18 subsequently deposited thereon. In that photo, a darkened area 19 exists at the interface between conductors 12 and 18. That darkened area is the sulfonated epoxy breakdown byproducts which precipitated onto conductive layer 12 during the water rinse, and which could not subsequently be removed by the hot sodium hydroxide rinse.

A theoretical explanation of the above results will now be given in conjunction with FIG. 3. That figure illustrates the chemical makeup of the epoxy from which layers 14 and 15 in the above experiment were fabricated. Other epoxies could, of course, also be used since they too would have a similar chain like structure.

These chains in the epoxy are broken down and dissolved by the acid bath. The position of the breaks in the chain occur at random such as at links 20 and 21; and thus the byproducts vary in length. Also, some of the atoms and molecules of the acid attach themselves to the broken links. Thus, the byproducts of the acid bath also differ in their chemical makeup.

These byproducts remain in the solution so long as the concentration of the acid is relatively high. With sulfuric acid for example, the concentration must be greater than approximately 85%. Thus when the board is rinsed in water, the concentration of the acid drops which causes some of the breakdown byproducts to precipitate back onto the board.

In the present invention, the glycol ether (e.g. 2-butoxyethanol) acts as a solvent for the precipitated byproducts. Also, it breaks weak bonds between the epoxy chains which produces swelling and some further breakdown. Similarly, the base component of the mixture has two functions. It neutralizes any acid that may be left on the board; and it also acts as an emulsifier which keeps the redissolved epoxy breakdown products in solution.

Figure 4B:
FIG. 4b is a microphotograph of region 16b of the FIG. 1 board after it was treated in accordance with the prior art.

Further verification of the above theory is illustrated in FIGS. 4a and 4b. These figures are microphotos which are enlarged by approximately ×120 of hole portion 16b. The photo of FIG. 4a was taken after the board was rinsed in a mixture of 2-butoxyethanol and monoethanolamine as in accordance with the invention; whereas the photo of FIG. 4b was taken after the board was rinsed with hot sodium hydroxide as in accordance with the prior art.

In these figures, the white regions indicated by reference numeral 22 are the above described breakdown byproducts that attached to the side of the holes. These byproducts completely cover entire portions of the epoxy glass fibers 23 in the photo of FIG. 4b. But by comparison in FIG. 4a, the byproducts 22 are substantially reduced.

Various features and advantages of the invention have now been described in detail. In addition, many changes and modifications may be made to these details without departing from the nature and spirit of the invention. Therefore, it is to be understood that the invention is not limited to said details but as defined by the appended claims.

What is claimed is:

1. A method of fabricating electrical contacts between two conductive layers of a printed circuit board that are spaced apart by an epoxy layer, said method including the steps of:
   drilling holes through all of said layers at predetermined points where said electrical contacts are to be made;
   subsequently washing said board in an acid to remove epoxy smear formed on the walls of the holes by said drilling step; and
   thereafter rinsing said board in a mixture consisting of only two essential ingredients to remove chemical byproducts of said epoxy smear and said acid from said walls of said holes, said two essential ingredients being a glycol ether and a base.

2. A method according to claim 1, wherein said glycol ether is 2-butoxyethanol, and said base is an amine.

3. A method according to claim 2, wherein said amine is monoethanolamine.

4. A method according to claim 1, wherein glycol ether is 2-butoxyethanol, and said base is a hydroxide.

5. A method according to claim 4, wherein said hydroxide is sodium hydroxide.

6. A method according to claim 1, wherein said ether and said base each are combined in said mixture by essentially equal volumes.

7. A method according to claim 1, wherein said acid is sulfuric acid.

8. A method according to claim 1 and further including the step of depositing a conductive film on the sides of said holes subsequent to said rinsing step.

* * * * *